(12) United States Patent
Takekoshi (10) Patent No.: US 8,421,040 B2
(45) Date of Patent: Apr. 16, 2013

(54) WRITING APPARATUS AND WRITING METHOD

(75) Inventor: Hidekazu Takekoshi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 84 days.

(21) Appl. No.: 12/535,180

(22) Filed: Aug. 4, 2009

(65) Prior Publication Data

US 2010/0032588 A1 Feb. 11, 2010

(30) Foreign Application Priority Data

Aug. 5, 2008 (JP) ................................. 2008-201443

(51) Int. Cl.
*G21K 5/10* (2006.01)
(52) U.S. Cl.
USPC .................................. 250/492.22; 250/492.1
(58) Field of Classification Search ............. 250/492.22, 250/492.3, 492.2, 492.1, 492.23
See application file for complete search history.

(56) References Cited

U.S. PATENT DOCUMENTS

| | | | | |
|---|---|---|---|---|
| 4,967,088 A * | 10/1990 | Stengl et al. | ................ | 250/491.1 |
| 6,483,571 B1 * | 11/2002 | Shiraishi | ......................... | 355/53 |
| RE39,083 E * | 5/2006 | Nishi | .............................. | 355/53 |
| 7,248,349 B2 * | 7/2007 | Sato et al. | ....................... | 356/124 |
| 7,643,130 B2 * | 1/2010 | Yoshitake et al. | .............. | 355/75 |
| 2001/0013581 A1 * | 8/2001 | Takemoto et al. | ........ | 250/492.22 |
| 2005/0214657 A1 * | 9/2005 | Mitsui | ............................... | 430/5 |
| 2006/0151721 A1 * | 7/2006 | Nakasugi et al. | ........ | 250/492.22 |
| 2007/0103659 A1 * | 5/2007 | Yoshitake et al. | .............. | 355/53 |
| 2007/0109524 A1 * | 5/2007 | Kawakubo et al. | ............. | 355/77 |
| 2007/0109534 A1 * | 5/2007 | Shibata et al. | ............. | 356/237.5 |
| 2007/0111116 A1 * | 5/2007 | Noudo et al. | .................... | 430/22 |
| 2008/0299490 A1 * | 12/2008 | Takekoshi | ..................... | 430/296 |
| 2008/0316453 A1 * | 12/2008 | Nagasaka | ........................ | 355/53 |
| 2009/0206282 A1 * | 8/2009 | Ogino et al. | ............. | 250/492.22 |

FOREIGN PATENT DOCUMENTS

| | | |
|---|---|---|
| JP | 2004-184764 | 7/2004 |
| JP | 2007-72423 | 3/2007 |
| JP | 2008-145918 | 6/2008 |

OTHER PUBLICATIONS

Taiwanese Office Action with English translation mailed Nov. 8, 2012, in Taiwanese Patent Application No. 098126197.
Japanese Office Action with English translation mailed Jan. 22, 2013, in Japanese Patent Application No. 2008-201443, filed Aug. 5, 2008.

* cited by examiner

*Primary Examiner* — Robert Kim
*Assistant Examiner* — Jason McCormack
(74) *Attorney, Agent, or Firm* — Oblon, Spivak, McClelland, Maier & Neustadt, L.L.P.

(57) ABSTRACT

A writing apparatus includes a writing unit configured to write a first pattern onto a first mask substrate and a second pattern being complementary to the first pattern onto a second mask substrate using a charged particle beam, and an addition unit configured to add a positional deviation amount of the first pattern having been written on the first mask substrate to a writing position of the second pattern, wherein the writing unit writes the second pattern at the writing position on the second mask substrate, where the positional deviation amount of the first pattern has been added.

6 Claims, 7 Drawing Sheets

Related Art

FIG. 8

Related Art

FIG. 9

WRITING APPARATUS AND WRITING METHOD

CROSS-REFERENCE TO RELATED APPLICATION

This application is based upon and claims the benefit of priority from the prior Japanese Patent Application No. 2008-201443 on Aug. 5, 2008 in Japan, the entire contents of which are incorporated herein by reference.

BACKGROUND OF THE INVENTION

1. Field of the Invention

The present invention relates to a writing apparatus and a writing method, and more particularly to an apparatus and a method for writing complementary patterns used for double patterning or double exposure.

2. Description of Related Art

The lithography technology which promotes micro-miniaturization of semiconductor devices is extremely important as being the only process whereby patterns are formed in the semiconductor manufacturing. In recent years, with the high integration of LSI, the line width (critical dimension) required for semiconductor device circuits is decreasing year by year. Then, in order to form a desired circuit pattern on such semiconductor devices, there is a need for a highly accurate master or "original" pattern (also called a mask or a reticle).

Therefore, with the miniaturization of the circuit critical dimension, an exposure light source having a shorter wavelength is required. As a method for extending the life of an ArF laser, which is an example of the exposure light source, a double exposure technique and a double patterning technique attract attention in recent years. The double exposure is a method of continuously exposing the same region on a resist coated wafer while exchanging two masks. (For example, refer to Patent Literature 1.) Then, through developing and etching processes, a desired pattern is formed on the wafer. On the other hand, the double patterning is a method of exposing a resist coated wafer by using the first mask, and after developing and etching processes, the wafer is coated with resist again so that the same region thereof may be exposed using the second mask. These techniques have an advantage in that they can be performed as an extension of the current technique. In these techniques, two masks are necessary for obtaining a desired pattern on the wafer.

Figure 8:
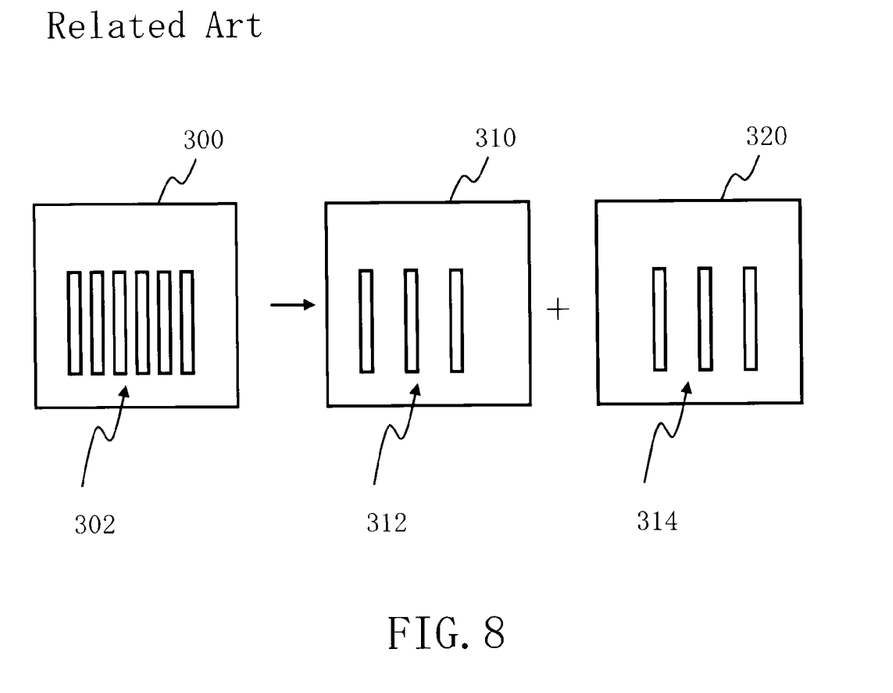
FIG. 8 is a schematic diagram for explaining masks used for double patterning.

FIG. 8 is a schematic diagram showing masks used for the double patterning. In order to expose a desired pattern 302 onto the wafer, since sufficient resolution cannot be obtained by using a photomask 300, the mask needs to be divided into two as shown in FIG. 8. That is, a pattern 312 being a part of the pattern 302 is formed on a photomask 310, and a pattern 314 being the residual part of the pattern 302 is formed on a photomask 320. Then, the two photomasks 310 and 320 are set in order in an exposure apparatus, such as a stepper and a scanner, to be exposed respectively.

These photomasks are manufactured using an electron beam writing apparatus. Since the electron beam writing technique intrinsically has excellent resolution, it is used for producing highly precise master patterns.

Figure 9:
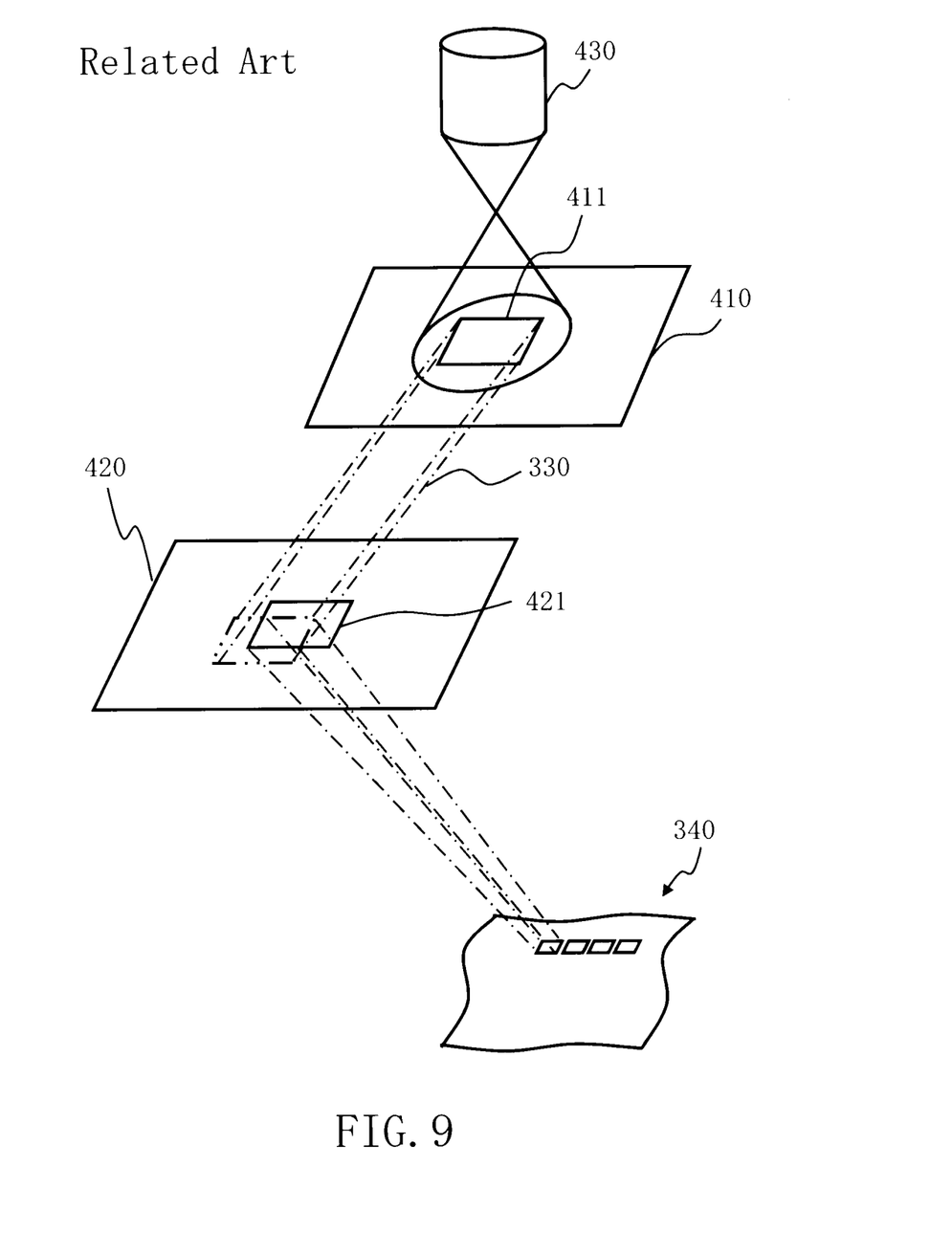
FIG. 9 is a schematic diagram showing operations of a variable-shaped type electron beam writing apparatus.

FIG. 9 is a schematic diagram showing operations of a variable-shaped type electron beam (EB) writing apparatus. The variable-shaped type electron beam writing apparatus operates as follows: A first aperture plate 410 has a quadrangular, such as a rectangular opening or "hole" 411 for shaping an electron beam 330. A second aperture plate 420 has a variable-shaped opening 421 for shaping the electron beam 330 that has passed through the opening 411 into a desired rectangular shape. The electron beam 330, emitted from a charged particle source 430 and having passed through the opening 411, is deflected by a deflector so as to pass through a part of the variable-shaped opening 421 and thereby to irradiate a target workpiece or "sample" mounted on a stage. The stage continuously moves in one predetermined direction (e.g. X direction) during writing or "drawing". In other words, a rectangular shape as a result of passing through both the opening 411 and the variable-shaped opening 421 is written in the writing region of a target workpiece 340 on the stage. This method of forming a given shape by letting beams pass through both the opening 411 and the variable-shaped opening 421 is referred to as a variable shaped method.

As described above, through the operations of the electron beam writing apparatus, a plurality of photomasks for the double exposure or for the double patterning exposure is manufactured. Then, when writing using the electron beam pattern writing apparatus, drift of the electron beam occurs as a temporal change. As a result, there is a problem that a positional deviation occurs between positions in writing the first mask and the second mask which are complementarily related, even when writing at a desired position. In the case of the positional deviation, consequently, a superposition error (overlay error) of the patterns occurs. For example, there is a problem that adjacent patterns which are to be separated from each other keeping a predetermined distance therebetween contact each other to cause a short circuit.

In the mask manufacturing process, as mentioned above, there is a problem that an error caused by drift of electron beams occurs between writing positions of complementary mask patterns. Therefore, there exists a problem in that a superposition error between patterns is induced when exposing using these two masks.

BRIEF SUMMARY OF THE INVENTION

It is an object of the present invention to provide a writing apparatus and a writing method that can reduce superposition errors between patterns.

In accordance with one aspect of the present invention, a writing apparatus includes a writing unit configured to write a first pattern onto a first mask substrate and a second pattern being complementary to the first pattern onto a second mask substrate using a charged particle beam, and an addition unit configured to add a positional deviation amount of the first pattern having been written on the first mask substrate to a writing position of the second pattern, wherein the writing unit writes the second pattern at the writing position on the second mask substrate, where the positional deviation amount of the first pattern has been added.

In accordance with another aspect of the present invention, a writing method includes writing a first pattern onto a first mask substrate using a charged particle beam, measuring a position of the first pattern having been written on the first mask substrate, and writing a second pattern being complementary to the first pattern onto a second mask substrate by shifting a position by a positional deviation amount of the first pattern obtained as a result of the measuring.

BRIEF DESCRIPTION OF THE WRITINGS

DETAILED DESCRIPTION OF THE INVENTION

Embodiment 1

In the following Embodiments, there will be described a structure using an electron beam as an example of a charged particle beam. However, the charged particle beam is not limited to the electron beam. Another charged particle beam, such as an ion beam, may also be used.

Figure 1:
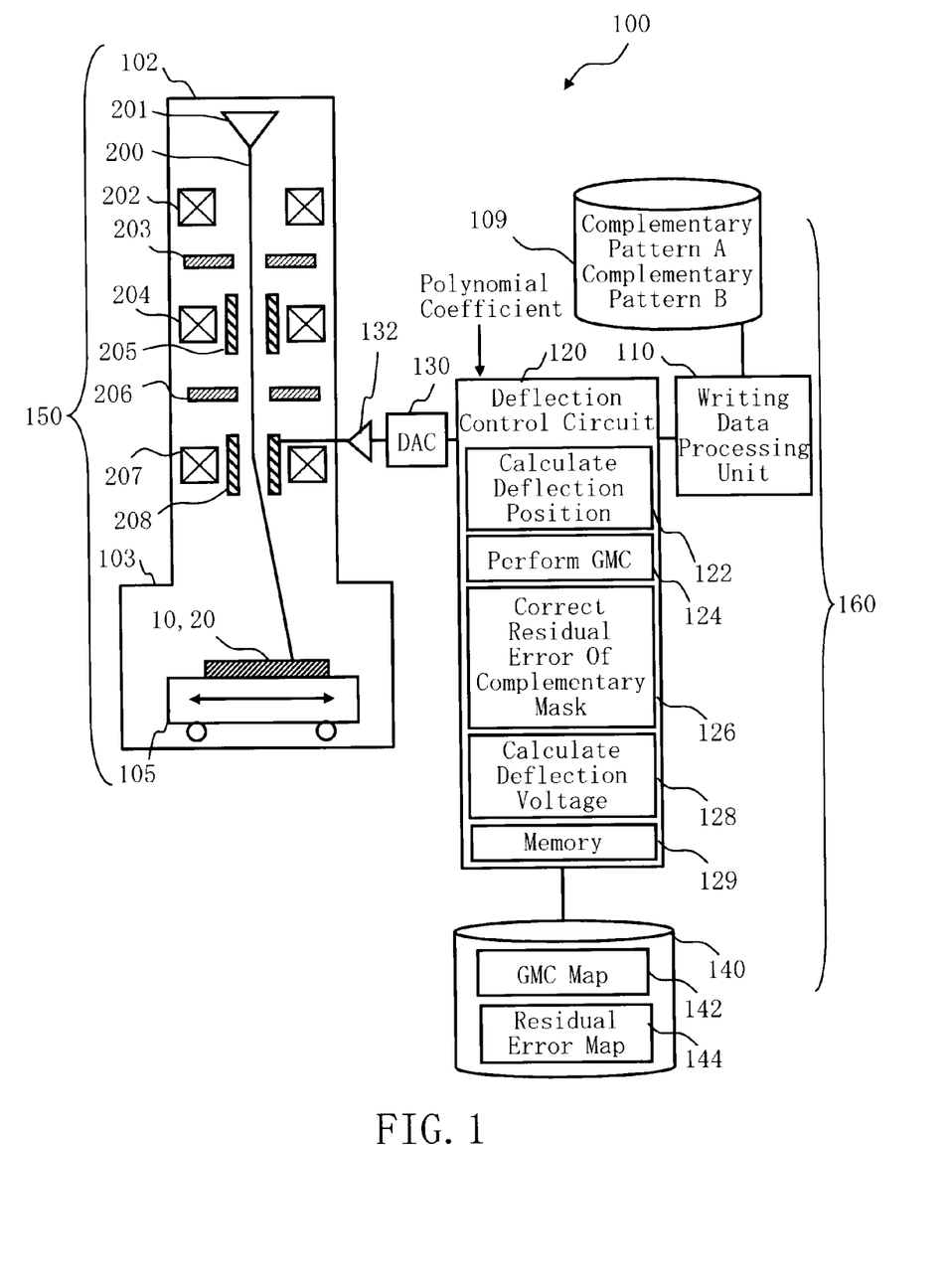
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 or "lithography apparatus 100" includes a writing unit 150 and a control unit 160. The writing apparatus 100 is an example of a charged particle beam writing apparatus. The writing unit 150 includes an electron lens barrel 102 and a writing chamber 103. The writing apparatus 100 writes one of two complementary patterns onto one of two mask substrates 10 and 20, and writes the other of the two complementary patterns onto the other of the mask substrates 10 and 20. The control unit 160 includes a writing data processing unit 110, a deflection control circuit 120, a digital-to-analog converter (DAC) 130, an amplifier 132, and magnetic disk drives 109 and 140. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is movably arranged an XY stage 105, on which the two mask substrates 10 and 20 are placed. As a typical example of the two mask substrates 10 and 20, a photomask substrate for double exposure or double patterning exposure can be cited. Such a mask substrate may be a mask blank in which no patterns are formed yet, for example. The deflection control circuit 120 includes a deflection position calculation unit 122, a grid matching correction (GMC) unit 124, a complementary mask residual error correction unit 126, a deflection voltage calculation unit 128, and a memory 129. In the deflection control circuit 120, processing of each function, such as the deflection position calculation unit 122, the grid matching correction unit 124, the complementary mask residual error correction unit 126, and the deflection voltage calculation unit 128, may be implemented by software. Alternatively, the deflection position calculation unit 122, the grid matching correction unit 124, the complementary mask residual error correction unit 126, and the deflection voltage calculation unit 128 may be configured by hardware such as an electric circuit. Alternatively, they may be executed by a combination of hardware and software, or a combination of hardware and firmware. When implemented by software or a combination of software and hardware etc., data to be input into the deflection control circuit 120 or data being processed or having been processed is stored in the memory 129 each time. In the magnetic disk drive 109, there are stored a writing data file in which one of the complementary patterns is defined and another writing data file in which the other of the complementary patterns is defined. In the magnetic disk drive 140 (storage unit), a GMC map 142 is stored, and after writing one of the complementary patterns, a residual error map 144 is to be stored. While only the structure elements necessary for explaining Embodiment 1 are shown in FIG. 1, it should be understood that other structure elements generally necessary for the writing apparatus 100 may also be included.

Figure 2:
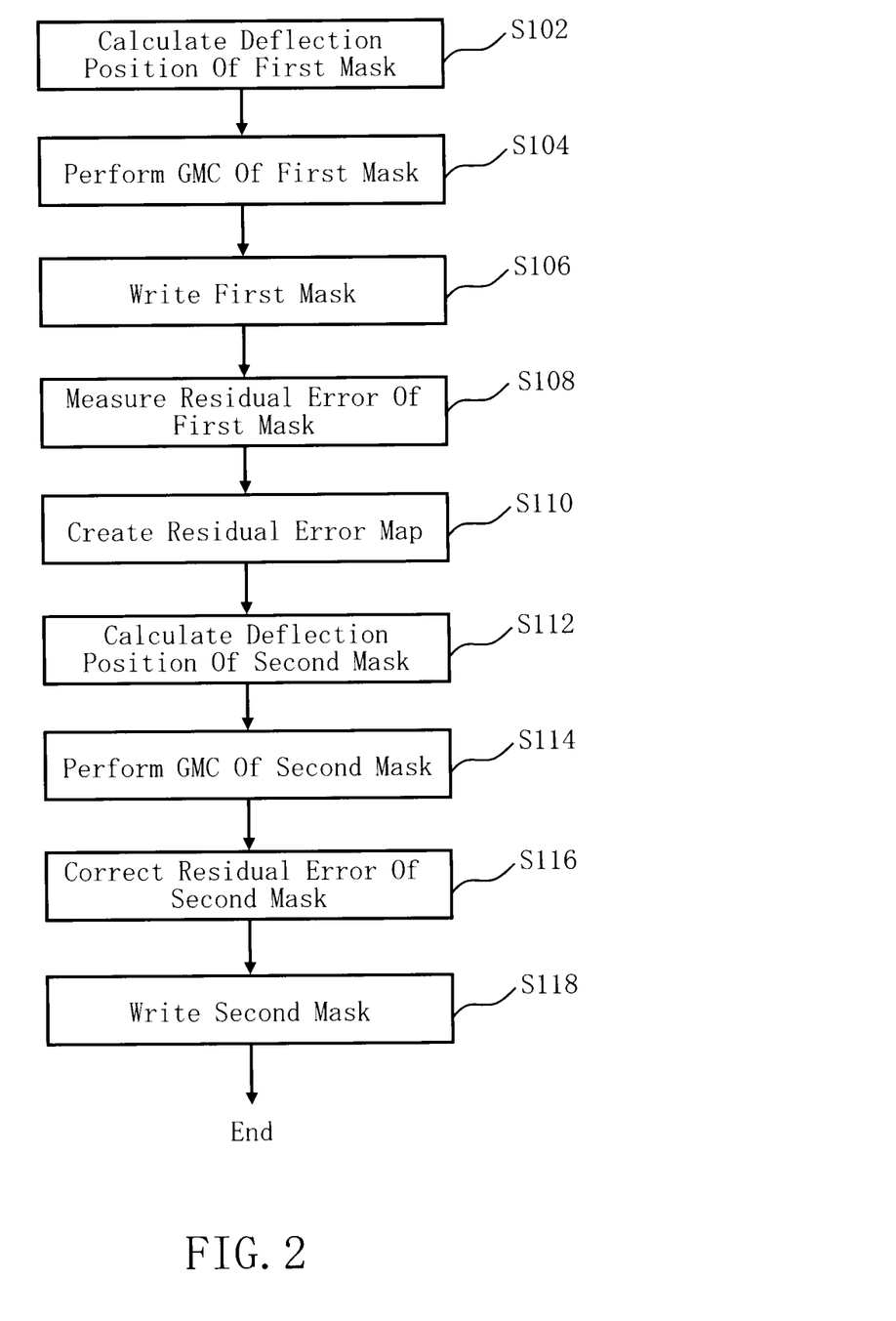
FIG. 2 is a flowchart showing main steps of a method for writing complementary patterns according to Embodiment 1.

FIG. 2 is a flowchart showing main steps of a method for writing complementary patterns according to Embodiment 1. As shown in FIG. 2, the writing method of the complementary pattern in Embodiment 1 executes each of the steps: a first mask deflection position calculation step (S102), a first mask grid matching correction (GMC) step (S104), a first mask writing step (S106), a first mask residual error measurement step (S108), a residual error map creation step (S110), a second mask deflection position calculation step (S112), a second mask grid matching correction (GMC) step (S114), a second mask residual error correction step (S116), and a second mask writing step (S118).

First, in the writing data processing unit 110, writing data in which one of the complementary patterns is defined is read from the magnetic disk drive 109, and converted into shot data of the format used in the apparatus. The shot data is output to the deflection control circuit 120. The shape and the writing position of a pattern will be controlled based on this shot data. Now, the writing position will be explained. On the XY stage 105, the mask substrate 10 (first mask substrate) which is to be written first as one of the complementary masks is placed.

In step S102, as a deflection position calculation step of the first mask, the deflection position calculation unit 122 calculates a deflection position of each shot that forms the complementary pattern to be written on the mask substrate 10. For example, it is preferable to perform the calculation by using polynomials as shown in the following equations (1-1) and (1-2). The case of calculating deflection position coordinates $(X_i, Y_i)$ of design coordinates $(x_i, y_i)$ will be described as an example.

$$X_i = a_0 + a_1 \cdot x + a_2 \cdot y + a_3 \cdot x^2 + a_4 \cdot xy + a_5 \cdot y^2 + a_6 \cdot x^3 + a_7 \cdot x^2 y + a_8 \cdot xy^2 + a_9 \cdot y^3 \quad (1\text{-}1)$$

$$Y_i = b_0 + b_1 \cdot x + b_2 \cdot y + b_3 \cdot x^2 + b_4 \cdot xy + b_5 \cdot y^2 + b_6 \cdot x^3 + b_7 \cdot x^2 y + b_8 \cdot xy^2 + b_9 \cdot y^3 \quad (1\text{-}2)$$

The coefficients $a_0$ to $a_9$ and $b_0$ to $b_9$ may be obtained by approximating position data, which was measured prior to the writing, and be set in the deflection control circuit 120. For example, the coordinate system of the writing apparatus is corrected based on an error between a measured position and a design position by performing calibration, etc. of the electron beam 200. While the third order polynomial is used in this case, it is not limited thereto, and the n-th order polynomial may also be used. This polynomial can correct a positional deviation between the design coordinate and the position actually written. However, such correction may not be sufficient. Then, it is preferable to further perform GMC in the writing apparatus 100.

In step S104, as a grid matching correction (GMC) step of the first mask, the grid matching correction unit 124 reads the GMC map 142 from the magnetic disk drive 140, and corrects the deflection position $(X_i, Y_i)$ which has already been calculated. When the correction was not completely performed by the third order polynomial mentioned above, it is effective to correct herein by using the map. The GMC map 142 is created prior to the writing. In the writing apparatus 100, for correcting the coordinate system of the writing apparatus 100 to be an ideal one, the whole surface of the mask to be written is divided into grids having predetermined dimensions, in a mesh-like state, and the position of the apex of each mesh is measured. Then, based on the error between the measured position and the design position, the coordinate system of the writing apparatus is corrected. This function is called the "grid matching correction (GMC). Specifically, a pattern for GMC measurement is written at the position corresponding to the apex of each mesh on the mask blank coated with resist. Then, after performing processing such as developing and etching for the mask, the position accuracy is measured from the pattern written. Based on measured results, the GMC map 142 for correcting positions is created.

Figure 3:
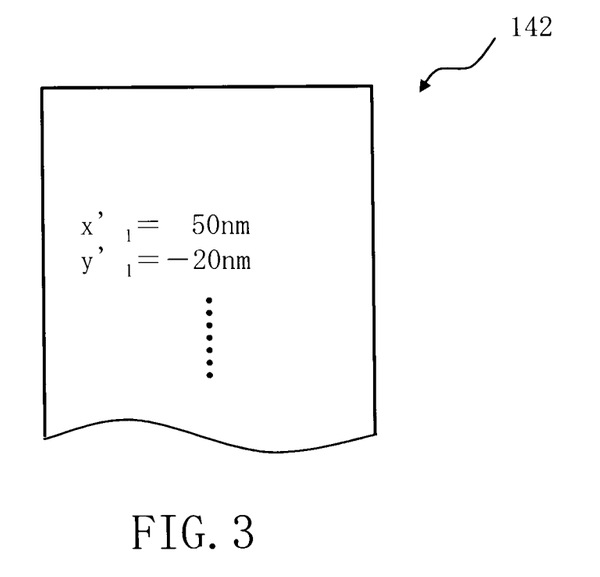
FIG. 3 shows as an example of the data file of a GMC map according to Embodiment 1.

FIG. 3 shows as an example of a data file of the GMC map according to Embodiment 1. The correction amount $(x'_i, y'_i)$ for correcting the dimension error at the design coordinates $(x_i, y_i)$ is defined as data of the GMC map 142 as shown in FIG. 3. In this case, $x'_1=50$ nm and $y'_1=-20$ nm are shown as an example.

Using this GMC map 142, the coordinate system of the writing apparatus is corrected. The coordinates $(X'_i, Y'_i)$ after the grid matching correction (GMC) can be obtained by the following equations (2-1) and (2-2), for example.

$$X'_i = X_i + x'_i \quad (2\text{-}1)$$

$$Y'_i = Y_i + y'_i \quad (2\text{-}2)$$

In this case, there is shown correction is performed by reading the correction amount $(x'_i, y'_i)$ for correcting the dimension error at the design coordinates $(x_0, y_0)$ from the GMC map 142, and adding it to the already calculated deflection position coordinates $(X_i, Y_i)$. Then, the deflection voltage calculation unit 128 calculates a deflection voltage (Ex, Ey) to be used as a deflection amount for deflecting the electron beam 200 by the deflector 208, using the deflection position coordinates $(X'_i, Y'_i)$ obtained after the correction as arguments. The deflection voltage can be calculated by the following equations (3-1) and (3-2).

$$Ex = F(X'_i) \quad (3\text{-}1)$$

$$Ey = G(Y'_i) \quad (3\text{-}2)$$

In step S106, as a writing step of the first mask, the writing unit 150 writes one (first pattern) of the complementary patterns onto the first mask substrate 10, using the electron beam 200. Specifically, first, a deflection voltage (Ex, Ey) signal being a digital signal is output from the deflection control circuit 120 to the DAC 130. Then, the signal is converted into an analog deflection voltage in the DAC 130, and amplified by the amplifier 132 to be applied to the deflector 208. Operations of the writing unit 150 will now be described below.

The electron beam 200 emitted from the electron gun assembly 201, which is an example of an irradiation unit, irradiates the entire first aperture plate 203 having a quadrangular, such as a rectangular opening, by the illumination lens 202. At this point, the electron beam 200 is shaped to be a quadrangle such as a rectangle. Then, after having passed through the first aperture plate 203, the electron beam 200 of a first aperture image is projected onto the second aperture plate 206 by the projection lens 204. The position of the first aperture image on the second aperture plate 206 is deflection-controlled by the deflector 205 so as to change the shape and size of the beam. Thereby, the electron beam 200 has been shaped. After having passed through the second aperture plate 206, the electron beam 200 of a second aperture image is focused by the objective lens 207 and deflected by the deflector 208. As a result, the shaped electron beam 200 reaches a desired position on the mask substrate 10 placed on the XY stage 105. Since the XY stage 105 moves continuously, the writing apparatus 100 performs writing while the XY stage 105 is continuously moving. Alternatively, the stage may move in a step and repeat manner. In that case, the writing apparatus 100 performs writing while the XY stage 105 is stopping during the step and repeat movement.

As mentioned above, one (first pattern) of the complementary patterns is written onto the mask substrate 10 used as the first mask substrate. It is preferable for the first pattern to include a plurality of patterns for measurement.

Figure 4:
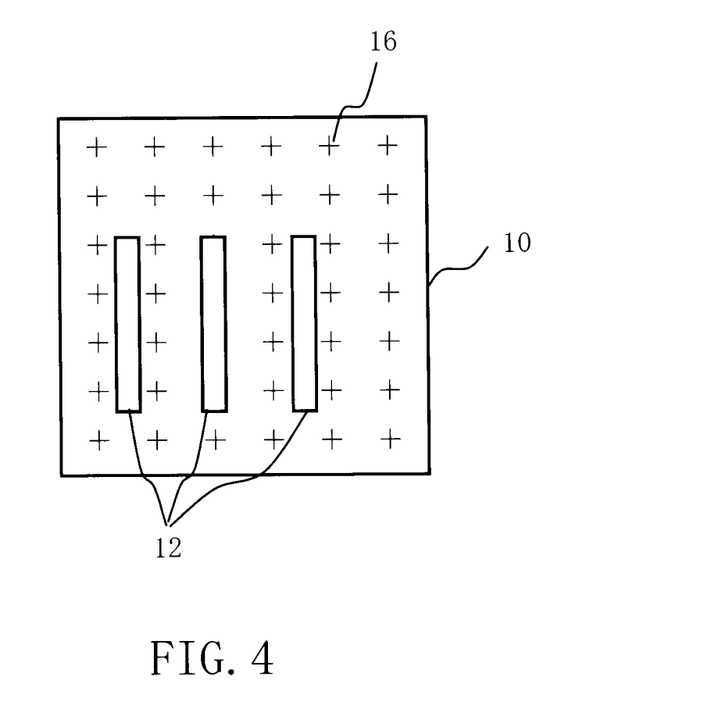
FIG. 4 shows an example of the pattern written priorly to the other of the two complementary patterns according to Embodiment 1.

FIG. 4 shows an example of the pattern written priorly to the other of the two complementary patterns according to Embodiment 1. As shown in FIG. 4, a plurality of patterns 16 for measurement is also written on the mask substrate 10 in addition to the original pattern 12. These patterns 16 for measurement will be used to measure a dimension error of the first pattern mentioned later. Therefore, it is preferable to write the patterns 16 such that they are arranged all over the mask surface. While the shape of the pattern 16 is not particularly limited, it is preferable to have the shape of a cross, for example.

Next, the other (second pattern) of the complementary patterns is to be written on the mask substrate 20 used as the second mask substrate. However, if the other pattern is written as it is, there is a possibility that a short circuit may occur as mentioned above because, with the temporal change of the beam drift, the first pattern contacts the second pattern when the first and second patterns are exposed onto the semiconductor substrate etc. Therefore, in Embodiment 1, a dimension error of the first pattern which has already been written on the mask substrate 10 is measured and then the second pattern is written onto the mask substrate 20 in view of the error.

In step S108, as a residual error measurement step of the first mask, the written mask substrate 10 is moved out of the writing apparatus 100 in order to measure a positional deviation amount of the pattern having been written on the mask substrate 10. In this case, since a plurality of patterns 16 for measurement are written, positional deviations of them are measured. Thus, the amount of the positional deviation of the first pattern is measured at a plurality of positions on the substrate surface of the first mask substrate 10.

In step S110, as a residual error map creation step, the residual error map 144, where the positional deviation of the pattern written on the mask substrate 10 is defined at each position, is created based on the measurement result. At this point, not a correction amount for correcting the positional deviation but a positional deviation amount itself is defined. The positional deviation amount at each coordinate of the first pattern may be defined as an approximated value at each corresponding coordinate on the map, obtained or "calculated" from the approximate equation of the positional deviation acquired from patterns 16 for measurement measured at a plurality of positions. The created residual error map 144 is stored in the magnetic disk drive 140. It is preferable to generate the format of the data file of the residual error map 144 to be in the form that can also be used in other writing apparatus. The reason for this is that such format can respond even when the mask substrate 10 and the mask substrate 20 are written by different writing apparatuses.

Figure 5:
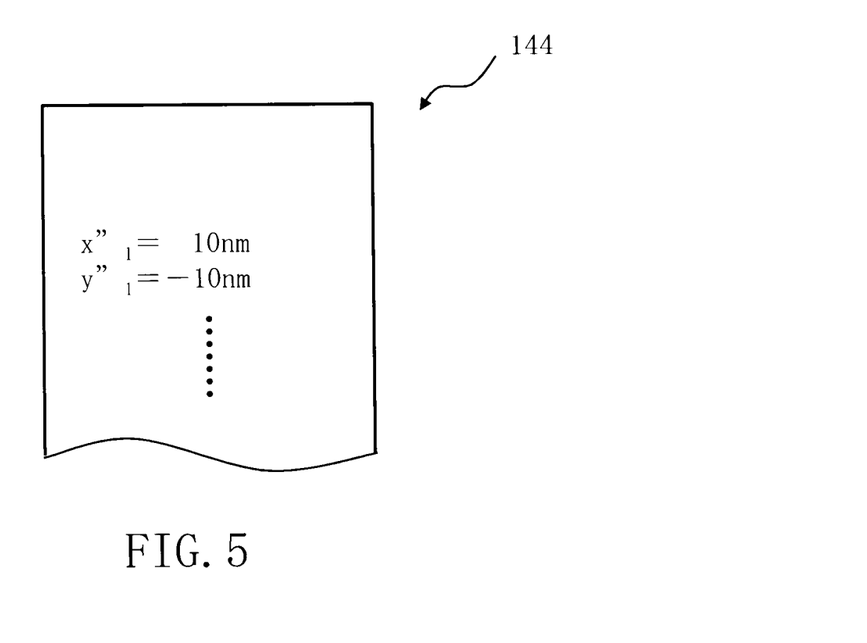
FIG. 5 shows an example of the data file of the residual error map of the pattern priorly written in Embodiment 1.

FIG. 5 shows an example of the data file of the residual error map of the pattern priorly written in Embodiment 1. In FIG. 5, the positional deviation amount $(x''_i, y''_i)$ of the pattern 16 for measurement at design coordinates $(x_i, y_i)$ is defined as data of the residual error map 144. In this case, $x''_1=10$ nm and $y''_1=-10$ nm are shown as an example.

It may be difficult to arrange the pattern 16 for measurement on the mask substrate 10 depending on the layout of the pattern 12 to be actually arranged. In such a case, it is acceptable to measure a positional deviation of the writing position of the pattern 12 being an actual pattern. In that case, the residual error map 144 may be created based on the positional deviation of the actual pattern.

Then, the mask substrate 20 (second mask substrate) being the other of the complementary masks will be written. First, in the writing data processing unit 110, writing data in which the other (second pattern) of the complementary patterns is defined is read from the magnetic disk drive 109, and converted into shot data of the format used in the apparatus. Then, the shot data is output to the deflection control circuit 120. Based on this shot data, the shape and writing position of the pattern is to be controlled. The writing position will also be particularly described. Then, the mask substrate 20 being the other of the complementary masks to be written later is arranged on the XY stage 105. Now, the steps will be explained in order.

In step S112, as a deflection position calculation step of the second mask, the deflection position calculation unit 122 calculates a deflection position of each shot that forms the complementary pattern to be written on the mask substrate 20. It is preferable to perform the calculation by also using polynomials as shown in the equations (1-1) and (1-2) whose coefficients had already been set beforehand.

In step S114, as a grid matching correction (GMC) step of the second mask, the GMC unit 124 reads the GMC map 142 previously prepared from the magnetic disk drive 140, and corrects the deflection position $(X_i, Y_i)$ of the shot for the second pattern which has already been calculated. The method of correction is the same as that for the deflection position of the shot for the first pattern. That is, the coordinates $(X'_i, Y'_i)$ after the grid matching correction can be obtained by the equations (2-1) and (2-2). If the deflection voltage is calculated as it is, it cannot respond to the temporal change of the writing position produced during from writing the first pattern to writing this second pattern. Then, in Embodiment 1, the writing position is corrected using the residual error map 144 as described below.

In step S116, as a residual error correction step of the second mask, the complementary mask residual error correction unit 126 reads the residual error map 144 from the magnetic disk drive 140, and corrects the position of the second pattern to be shifted by the amount of the positional deviation of the first pattern written on the mask substrate 10. For example, the coordinates $(X''_i, Y''_i)$ of after the residual error correction can be obtained by the following equations (4-1) and (4-2).

$$X''_i = X'_i + x''_i \quad (4\text{-}1)$$

$$Y''_i = Y'_i + y''_i \quad (4\text{-}2)$$

In this case, there is shown correction is performed by acquiring the positional deviation $(x''_i, y''_i)$ of the first pattern at the design coordinates $(x_0, y_0)$ from the read residual error map 144, and adding it to the already calculated deflection position coordinates $(X'_i, Y'_i)$ of after the GMC corresponding to the design coordinates $(x_0, y_0)$. The complementary mask residual error correction unit 126 serves as an example of an addition unit. Thus, it is preferable that the complementary mask residual error correction unit 126 adds a value at a position of the first pattern acquired from the approximate equation acquired using positional deviations of the first pattern, measured at a plurality of positions, as a positional deviation amount at the position of the first pattern, to the writing position of the second pattern corresponding to the position of the first pattern. Then, the deflection voltage calculation unit 128 calculates a deflection voltage (Ex, Ey) to be used as an amount of deflecting the electron beam 200 by the deflector 208, while using the deflection position coordinates $(X''_i, Y''_i)$ of after the correction, obtained as mentioned above, as arguments. The deflection voltage can be obtained by substituting $X''_i$ for $X'_i$ and $Y''_i$ for $Y'_i$ in the equations (3-1) and (3-2).

In step S118, as a writing step of the second mask, the writing unit 150 writes the other (second pattern) of the complementary patterns onto the second mask substrate 20 using the electron beam 200. Specifically, first, a deflection voltage (Ex, Ey) signal for the second pattern, being a digital signal, is output to the DAC 130 from the deflection control circuit 120. Then, the signal is converted into an analog deflection voltage in the DAC 130, amplified by the amplifier 132, and applied to the deflector 208. Then, it is written by the writing unit 150. Operations of the writing unit 150 have already been described above.

Thus, the other (second pattern) of the complementary patterns is written onto the mask substrate 20 serving as the second mask substrate.

Figure 6:
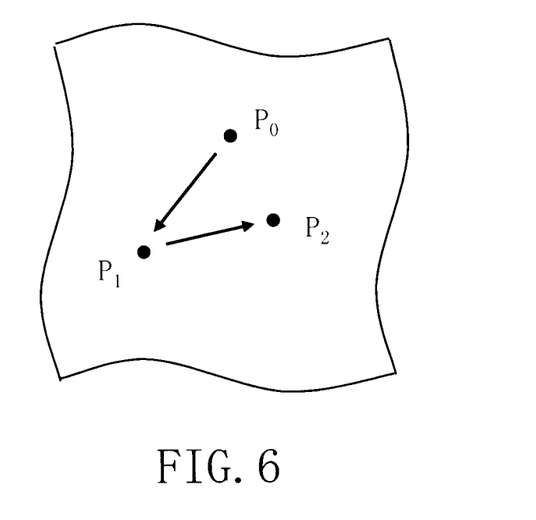
FIG. 6 is a schematic diagram for explaining change of a writing position according to Embodiment 1.

FIG. 6 is a schematic diagram for explaining the change of the writing position according to Embodiment 1. In FIG. 6, first, the deflection position $P_0$ is obtained by performing a deflection position calculation. Then, the position $P_0$ is corrected to the position denoted by $P_1$, based on the GMC map 142. However, if nothing is done, it cannot respond to the temporal change of the writing position. Then, the position $P_1$ is corrected to the position denoted by $P_2$ by shifting by the positional deviation of the first pattern, based on the residual error map 144. Thus, deviation of the positional relation between the first pattern and the second pattern can be reduced by correcting the second pattern at the time of its being written while regarding the positional deviation of the first pattern as a writing position temporal change produced during from the first pattern writing to the second pattern writing. As a result, contact between the first pattern and the second pattern can be avoided.

Figure 7:
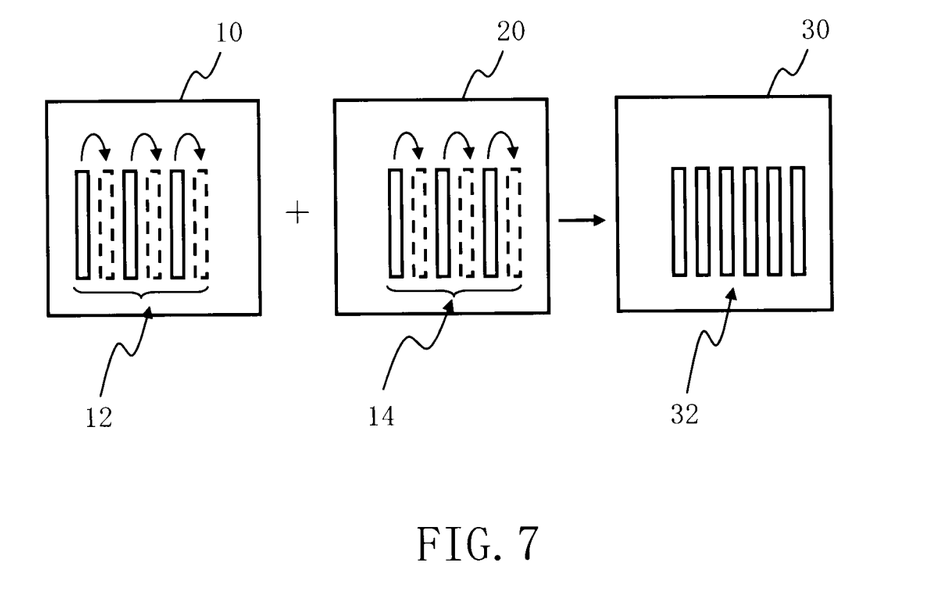
FIG. 7 shows an example of patterns on two mask substrates and a pattern of after double patterning according to Embodiment 1.

FIG. 7 shows an example of patterns on the two mask substrates and a pattern of after the double patterning according to Embodiment 1. As shown in FIG. 7, when the pattern 12 of the mask substrate 10 previously written deviates from the position shown by the solid line to the one shown by the dotted line, the pattern 14 of the mask substrate 20 is also written shiftedly from the solid line position to the dotted line position. Therefore, the pattern 32 finally exposed onto the wafer 30 using the two mask substrates 10 and 20 can maintain the positional relationship between the patterns 12 and 14, thereby reducing the deviation of the positional relation.

According to Embodiment 1, as described above, since the position of one pattern (second pattern) is shifted by the positional deviation of the other pattern (first pattern), the superposition error of the two patterns can be reduced. Therefore, contact of the adjacent patterns can be avoided.

While the embodiment has been described with reference to specific examples, the present invention is not limited thereto. The method mentioned above can be similarly applied to a photomask for double exposure which exposes a plurality of complementary patterns in a superimposed manner. Moreover, while the grid matching correction (GMC) step (S114) of the second mask is performed in the example mentioned above, it is not limited thereto. It is acceptable even to omit the GMC step (S114) of the second mask, and to perform the residual error correction step (S116) of the second mask following the deflection position calculation step (S112) of the second mask. Moreover, it is also acceptable even to omit the GMC step (S104) of the first mask.

While description of the apparatus structure, control method, etc. not directly required for explaining the present invention is omitted, some or all of them may be suitably selected and used when needed.

In addition, any other writing apparatus and writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing apparatus comprising:
   a deflection position calculation unit configured to calculate a deflection position for a first pattern by using a design position for the first pattern, and to calculate a deflection position for a second pattern by using a design position for the second pattern, the second pattern being complementary to the first pattern;
   a storage device configured to store a correction map;
   a correction unit configured to read the correction map from the storage device, and to correct the deflection position for the first pattern based on the correction map, and to correct the deflection position for the second pattern based on the correction map;
   a writing unit configured to write a first pattern at the deflection position for the first pattern, which has already been corrected and a plurality of measurement patterns for measurement onto a first mask substrate using a charged particle beam; and
   an addition unit configured to add a positional deviation amount of the first pattern having been written on the first mask substrate to the deflection position for the second pattern, which has already been corrected,
   wherein positional deviation amounts of the plurality of measurement patterns, the first pattern and the plurality of measurement patterns having been written onto the first mask substrate, are measured, the positional deviation amount of the first pattern is obtained by using the positional deviation amounts of the plurality of measurement patterns measured, and the writing unit writes the second pattern being complementary to the first pattern at the deflection position of the second pattern, to which the positional deviation amount of the first pattern has already been added, onto a second mask substrate using a charged particle beam.

2. The apparatus according to claim 1, wherein positional deviation amounts of the first pattern are measured at a plurality of positions on a surface of the first mask substrate, and the addition unit adds a value at a position of the first pattern calculated from an approximate equation acquired from positional deviation amounts of the first pattern, measured at the plurality of positions, as the positional deviation amount at the position of the first pattern, to the writing position of the second pattern corresponding to the position of the first pattern.

3. The apparatus according to claim 1 further comprising a storage unit configured to store a map showing a positional deviation amount at any position of the first pattern,
   wherein the addition unit reads the map from the storage unit and acquires a positional deviation amount of the first pattern to be added to a position of the second pattern, from the read map.

4. The apparatus according to claim 3, wherein an approximated value at each coordinate of the map is calculated using an approximate equation acquired from positional deviation amounts of the plurality of patterns for measurement.

5. The apparatus according to claim 4 wherein the approximated value at a coordinate of the map is used as the positional deviation amount of the first pattern to be added to a position of the second pattern corresponding to the coordinate.

6. A writing method comprising:
   calculating a deflection position for a first pattern by using a design position for the first pattern;
   reading a correction map from a storage device, and correcting the deflection position for the first pattern based on the correction map;
   writing a first pattern at the deflection position for the first pattern, which has already been corrected and a plurality of measurement patterns for measurement onto a first mask substrate using a charged particle beam;
   measuring positional deviation amounts of the plurality of measurement patterns, the first pattern and a plurality of measurement patterns having been written on the first mask substrate;
   obtaining a positional deviation amount of the first pattern by using the positional deviation amounts of the plurality of measurement patterns;
   calculating a deflection position for a second pattern by using a design position for the second pattern;
   reading the correction map from the storage device, and correcting the deflection position for the second pattern based on the correction map;
   adding the positional deviation amount of the first pattern to the deflection position for the second pattern, which has already been corrected, the second pattern being complementary to the first pattern; and
   writing the second pattern being complementary to the first pattern at a deflection position of the second pattern, to which the positional deviation amount of the first pattern has already been added, onto a second mask substrate using a charged particle beam onto a second mask substrate.

* * * * *